United States Patent
Ichikawa

(10) Patent No.: US 10,234,081 B2
(45) Date of Patent: Mar. 19, 2019

(54) LIGHT-EMITTING DEVICE AND METHOD OF MANUFACTURING THE SAME

(71) Applicant: NICHIA CORPORATION, Anan-shi, Tokushima (JP)

(72) Inventor: Masatsugu Ichikawa, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/441,981

(22) Filed: Feb. 24, 2017

(65) Prior Publication Data

US 2017/0248280 A1 Aug. 31, 2017

(30) Foreign Application Priority Data

Feb. 29, 2016 (JP) .................................. 2016-037280

(51) Int. Cl.
*F21K 9/64* (2016.01)
*F21K 9/61* (2016.01)
(Continued)

(52) U.S. Cl.
CPC .................. *F21K 9/64* (2016.08); *F21K 9/61* (2016.08); *F21K 9/62* (2016.08); *F21K 9/68* (2016.08);
(Continued)

(58) Field of Classification Search
CPC ..... F21K 9/64; F21K 9/61; F21K 9/62; F21K 9/68; G02B 6/00; G02B 6/0033;
(Continued)

(56) References Cited

U.S. PATENT DOCUMENTS

| | | | |
|---|---|---|---|
| 2009/0101930 A1* | 4/2009 | Li | G02B 6/005 257/98 |
| 2010/0117111 A1 | 5/2010 | Illek et al. | |

(Continued)

FOREIGN PATENT DOCUMENTS

| | | |
|---|---|---|
| JP | 2005-210132 A | 8/2005 |
| JP | 2010525586 A | 7/2010 |

(Continued)

*Primary Examiner* — Bao Q Truong
(74) *Attorney, Agent, or Firm* — Hunton Andrews Kurth LLP

(57) ABSTRACT

A light-emitting device is provided. The light-emitting device includes a light-emitting element having a light-extracting surface, a light-guiding member, and a light-reflective member. The light-guiding member includes a first light-guiding member having an incident surface bonded to the light-extracting surface, a wavelength conversion member disposed spaced from the light-emitting element and having a surface adjacent to the incident surface of the first light-guiding member and configured to convert light from the first light-guiding member into light having a different wavelength, and a second light-guiding member adjacent to the wavelength conversion member and having a light-emission surface through which light from the wavelength conversion member is emitted to outside. The light-reflective member covers the light-emitting element and the light-guiding member so that the light-emission surface is exposed from the light reflective member.

18 Claims, 9 Drawing Sheets

(51) Int. Cl.
  *F21K 9/62*   (2016.01)
  *F21K 9/68*   (2016.01)
  *G02B 6/00*   (2006.01)
  *F21V 8/00*   (2006.01)
  *H01L 25/075* (2006.01)
  *H01L 33/50*  (2010.01)
  *H01L 33/58*  (2010.01)
  *H01L 33/60*  (2010.01)
  *H01L 33/64*  (2010.01)

(52) U.S. Cl.
  CPC .............. *G02B 6/00* (2013.01); *G02B 6/0033* (2013.01); *G02B 6/0055* (2013.01); *G02B 6/0065* (2013.01); *G02B 6/0076* (2013.01); *G02B 6/0083* (2013.01); *H01L 25/0753* (2013.01); *H01L 33/507* (2013.01); *H01L 33/58* (2013.01); *H01L 33/60* (2013.01); *H01L 33/644* (2013.01)

(58) Field of Classification Search
  CPC .. G02B 6/0055; G02B 6/0065; G02B 6/0076; G02B 6/0083; H01L 25/0753; H01L 33/507; H01L 33/58; H01L 33/60; H01L 33/644; F21V 2200/00; F21V 2200/30; F21V 2200/13; F21V 9/30; F21V 9/32
  See application file for complete search history.

(56) References Cited

U.S. PATENT DOCUMENTS

| | | |
|---|---|---|
| 2015/0340567 A1 | 11/2015 | Ichikawa |
| 2016/0054501 A1* | 2/2016 | Hikmet .............. G02B 6/0003 362/606 |
| 2016/0218260 A1 | 7/2016 | Hikmet et al. |

FOREIGN PATENT DOCUMENTS

| | | |
|---|---|---|
| JP | 2015-097235 A | 5/2015 |
| JP | 2015225862 A | 12/2015 |
| WO | 2010-044240 A1 | 4/2010 |
| WO | 2015036224 A1 | 3/2015 |

* cited by examiner

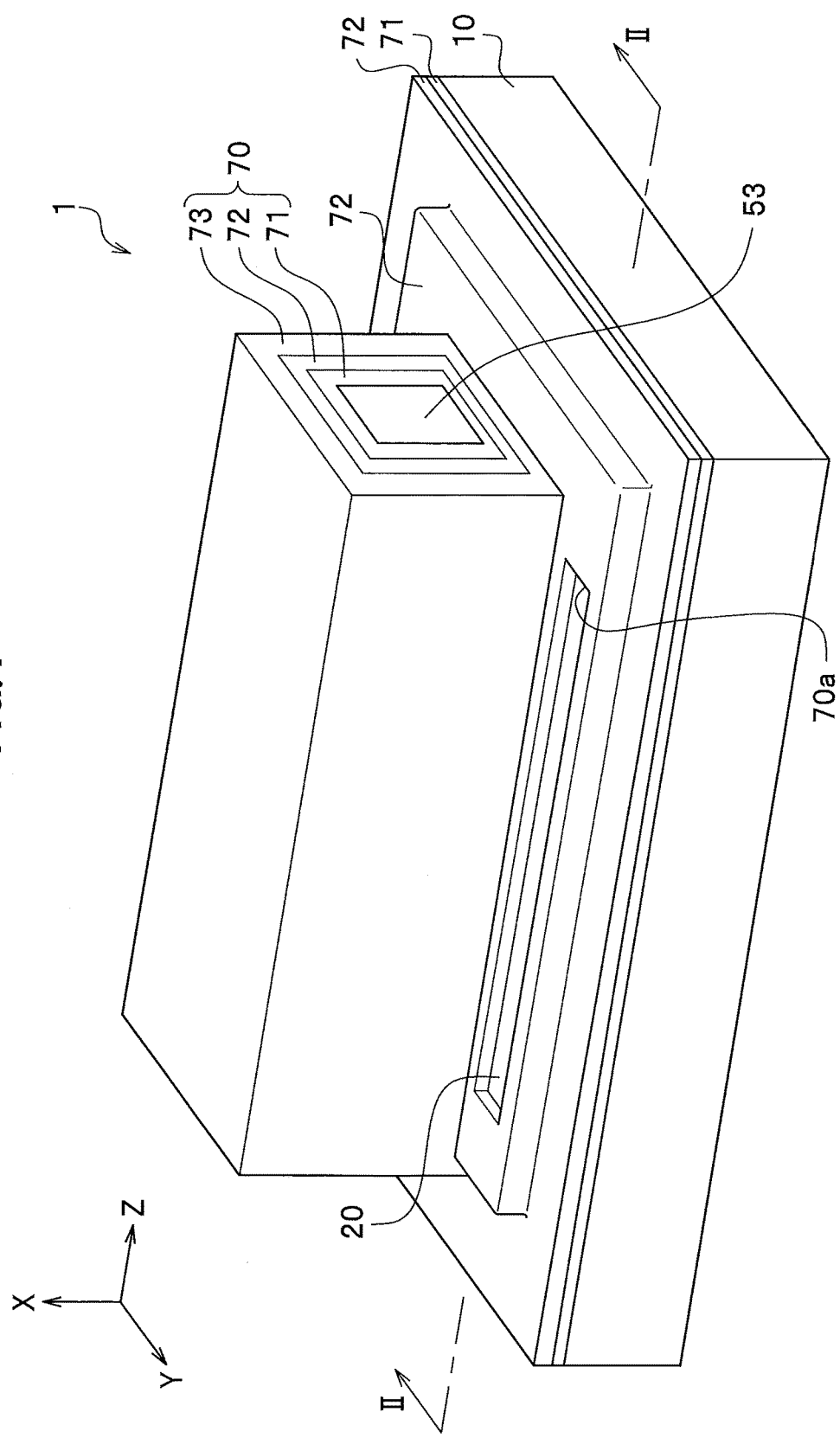

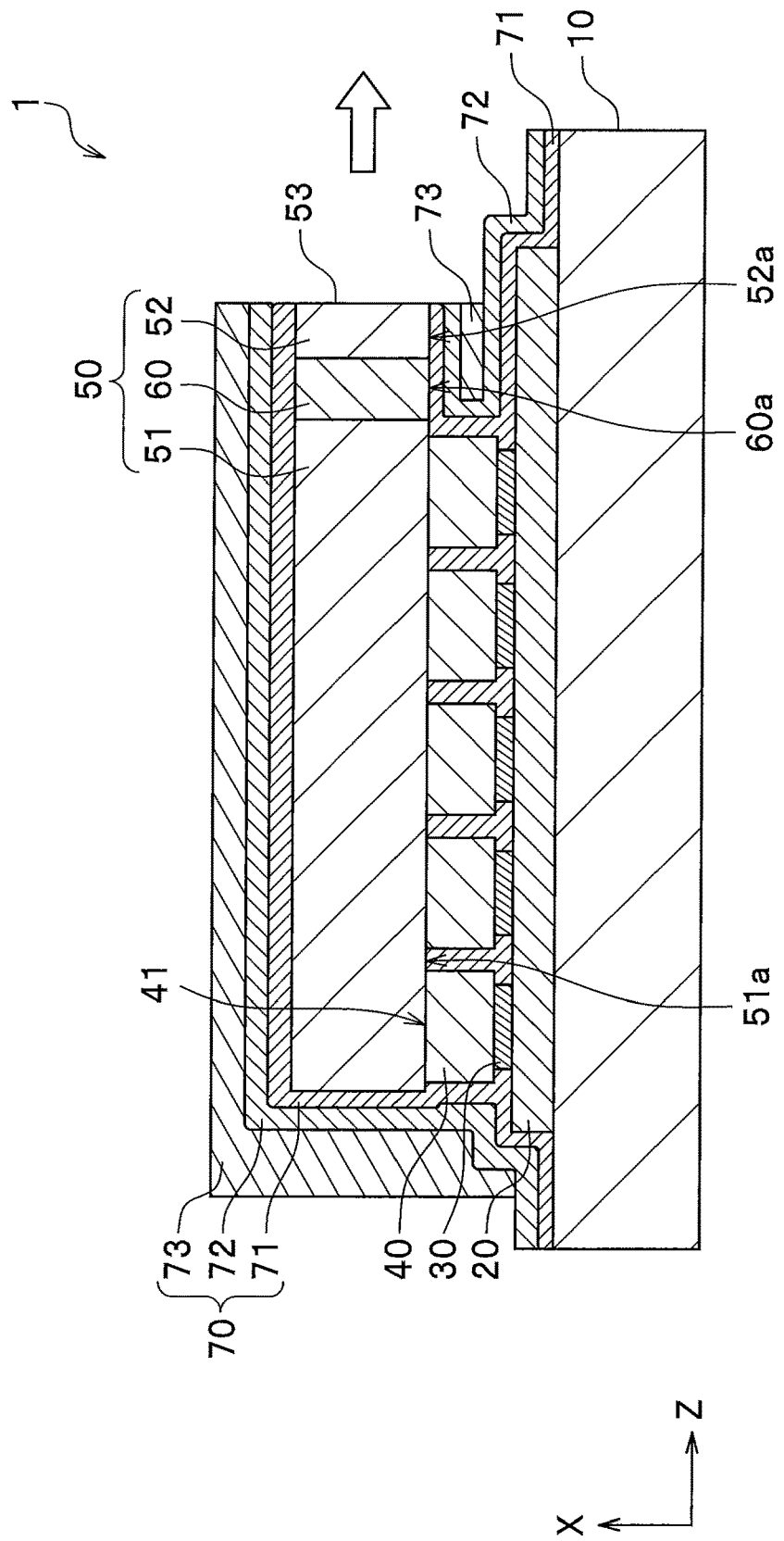

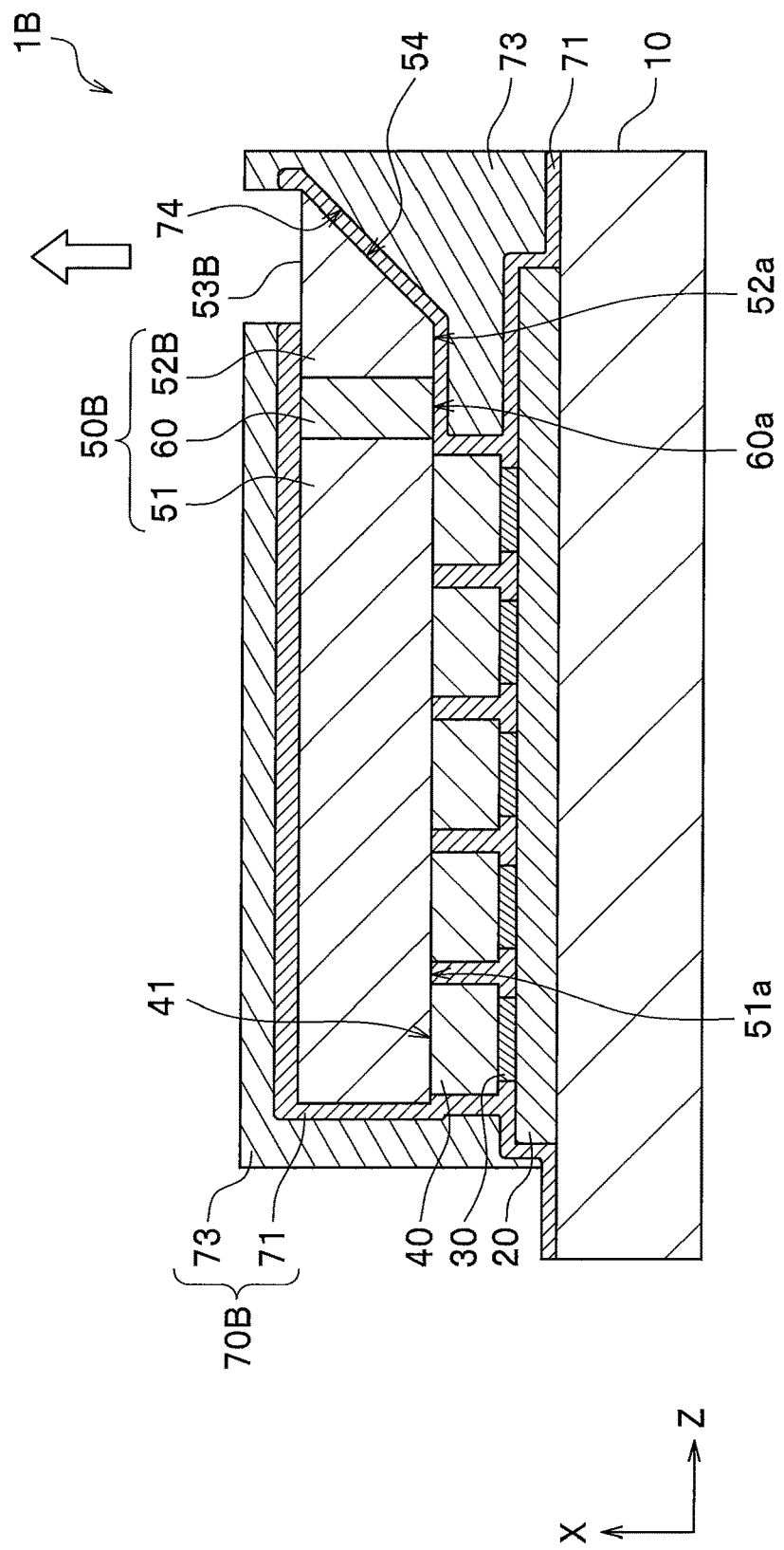

LIGHT-EMITTING DEVICE AND METHOD OF MANUFACTURING THE SAME

CROSS-REFERENCE TO RELATED PATENT APPLICATION

This application claims priority to Japanese Patent Application No. 2016-037280 filed on Feb. 29, 2016. The disclosure of Japanese Patent Application No. 2016-037280 is incorporated by reference herein in its entirety.

BACKGROUND

1. Technical Field

The present disclosure relates to a light-emitting device and a method of manufacturing the same.

2. Description of Related Art

A light-emitting device is proposed having a light-emitting area smaller than a light-emitting area of a light-emitting element therein to achieve high luminance (see WO 2010/044240, for example). The light-emitting device disclosed in WO 2010/044240 includes a light-emitting element, a wavelength conversion member arranged on a light-extracting surface of the light-emitting element, and a reflective film formed on surfaces of the wavelength conversion member. In these light-emitting devices, light emitted upward from the light-emitting element is guided in a direction approximately parallel to the light-extracting surface of the light-emitting element within the wavelength conversion member and is emitted from a lateral emission surface.

SUMMARY

With the light emitting device described in WO 2010/044240, light that has been transmitted through the wavelength conversion member is narrowed down, which allows light from the light-emitting element to be scattered repeatedly in the wavelength conversion member until the light reaches the emission surface, so that the light extraction efficiency may be decreased.

In view of the above, an embodiment according to the present disclosure has an object to provide a light-emitting device having better light extraction efficiency. Another object is to provide a simple method of manufacturing such a light-emitting device.

A light-emitting device according to certain embodiments of the present disclosure includes a light-emitting element having a light-extracting surface, a light-guiding member, and a light-reflective member. The light-guiding member includes a first light-guiding member having an incident surface bonded to the light-extracting surface, a wavelength conversion member disposed spaced from the light-emitting element and having a surface adjacent to the incident surface of the first light-guiding member and configured to convert light from the first light-guiding member into light having a different wavelength, and a second light-guiding member adjacent to the wavelength conversion member and having a light-emission surface through which light from the wavelength conversion member is emitted to outside. The light-reflective member covers the light-emitting element and the light-guiding member so that the light-emission surface is exposed from the light reflective member.

A method of manufacturing a light-emitting device according to other certain embodiments of the present disclosure includes: providing a light-guiding member including a first light-guiding member, a wavelength conversion member, and a second light-guiding member in this order; bonding the first light-guiding member to a light-emitting element; mounting the light-emitting element on a supporting member; covering the light-emitting element and the light-guiding member with a light-reflective member; and exposing a portion of a surface of the second light-guiding member from the light-reflective member to form a light-emission surface of the light-guiding member.

A method of manufacturing a light-emitting device according to yet other certain embodiments of the present disclosure includes providing a plurality of light-guiding members each including the first light-guiding member, the wavelength conversion member, and the second light-guiding member in this order, by forming a light-guiding member block that includes the first light-guiding member, the wavelength conversion member, and the second light-guiding member in this order, and dividing the light-guiding member block in a first direction; bonding a plurality of light-emitting elements to the first light-guiding member; covering the plurality of light-emitting elements and the light-guiding member with a light-reflective member; and exposing a portion of a surface of the second light-guiding member from the light-reflective member to form a light-emission surface of the light-guiding member.

With a light-emitting device according to an embodiment of the present disclosure, optical loss in a wavelength conversion member can be reduced. With a method of manufacturing a light-emitting device according to an embodiment of the present disclosure, a light-emitting device can be manufactured in which optical loss in a wavelength conversion member is reduced.

BRIEF DESCRIPTION OF THE DRAWINGS

FIG. 1 is a schematic perspective view of a light-emitting device according to a first embodiment.

FIG. 2 is a schematic cross-sectional view of the light-emitting device taken along the line II-II in FIG. 1.

FIG. 5 is a schematic cross-sectional view of a light-emitting device according to a second embodiment.

DETAILED DESCRIPTION

Figure 3A:
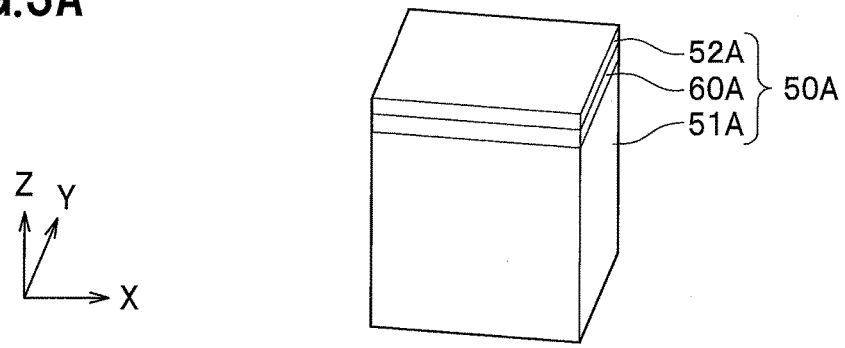
FIG. 3A is a schematic perspective view of a light-guiding member block for schematically illustrating an operation in manufacturing the light-emitting device according to the first embodiment.

In the description below, a light-emitting device and a method of manufacturing the light-emitting device according to certain embodiments are illustrated. The drawings referred to in the descriptions below schematically illustrate the present embodiment. The scales, the distances, the positional relationships, and the like of members may be exaggerated, or illustration of a part of a member may be omitted. In the descriptions below, the same term or reference number denotes the same or like member, and its detailed description will be omitted as appropriate.

First Embodiment

Structure of Light-Emitting Device 1

As shown in FIG. 1 and FIG. 2, a light-emitting device 1 according to a first embodiment includes a supporting member 10, electrically conductive wirings 20, a light-emitting element 40, a light-guiding member 50, and a light-reflective member 70. In the light-emitting device 1, light emitted from a light-extracting surface 41 of the light-emitting element 40 passes through the light-guiding member 50 covered with the light-reflective member 70, and is irradiated through a light-emission surface 53. The light-guiding member 50 includes a first light-guiding member 51 having an incident surface 51a bonded with the light-extracting surface 41 of the light-emitting element 40, a wavelength conversion member 60 having a surface 60a spaced from the light-extracting surface 41 of the light-emitting element 40 and adjacent to the incident surface 51a of the first light-guiding member 51, and a second light-guiding member 52 having a light-emission surface 53 for emitting light from the wavelength conversion member 60 to the outside, in this order. The wavelength conversion member 60 is configured to convert light from the first light-guiding member 51 into light having a different wavelength. The light-emission surface 53 of the light-guiding member 50 is exposed from the light-reflective member 70, and serves as the light-emission surface of the light-emitting device 1 to emit light that is emitted from the light-emitting element 40 to the outside.

In the description below, each member is illustrated in order. In the description below, a height direction of the light-emitting device 1 is indicated as an X-axis direction, a width direction of the light-emitting device 1 is indicated as a Y-axis direction, and a depth direction of the light-emitting device 1 is indicated as a Z-axis direction.

The supporting member 10 supports the light-emitting element 40 and the like. A typical package substrate for light-emitting devices can be used for the supporting member 10. Examples thereof include a ceramic substrate such as AlN, a metal substrate such as Al, and a resin substrate such as glass epoxy.

The electrically conductive wirings 20 are disposed on an upper surface of the supporting member 10. The electrically conductive wirings 20 are patterned into a predetermined shape on the supporting member 10 and configured to supply electricity to the light-emitting element 40 from the outside. As shown in FIG. 1, the light-reflective member 70 defines at least one opening 70a in which positive and/or negative electrically conductive wirings 20 is exposed to be electrically connected to an external power source.

Wirings generally used for package substrates of light-emitting devices can be used for the electrically conductive wirings 20. For such wirings, a metal material can be used, and preferable examples thereof include an element such as Ag, Al, Ni, Rh, Au, Cu, Ti, Pt, Pd, Mo, Cr, or W, or an alloy whose main component is one or more of these. A light-reflective elemental metal such as Ag, Al, Pt, or Rh, or an alloy whose main component is one or more of these metals can be more preferably used.

The light-emitting element 40 is mounted on the upper surface of the supporting member 10 and electrically connected to the electrically conductive wirings 20. The light-emitting element 40 includes a light-transmissive growth substrate such as sapphire, and a semiconductor layer on the light-transmissive growth substrate. The semiconductor layer includes an n-type semiconductor layer, an active region, and a p-type semiconductor layer in this order from the growth substrate side. The active region is configured to emit light having a first wavelength. The first wavelength can be selected from any appropriate wavelength in accordance with the intended use. For example, as a blue light emitting element (i.e., light having a wavelength of 430 to 490 nm), a nitride semiconductor such as a GaN-based or InGaN-based semiconductor represented by $In_XAl_YGa_{1-X-Y}N$ ($0 \leq X \leq 1$, $0 \leq Y \leq 1$, $X+Y \leq 1$) can be used.

The light-emitting element 40 preferably includes positive and negative electrodes on the same side. With this arrangement, the light-emitting element 40 can be flip-chip mounted on the supporting member 10. In the present embodiment, each of the positive and negative electrodes of the light-emitting element 40 is electrically connected to respective one of the electrically conductive wirings 20 of the supporting member 10 through bumps 30. For the bumps 30, a member made of, for example, gold or a solder can be used for the bumps 30.

For example, as illustrated in FIG. 2, the light-emitting device 1 may include a plurality of light-emitting elements 40. The upper surface of each of the light-emitting elements 40 is bonded with the light-guiding member 50. The light-emitting elements 40 are flip-chip mounted on the supporting member 10 such that a surface of each of the light emitting elements 40 on which the electrodes are formed is used as the lower surface, and an upper surface of each of the light emitting elements opposite to the lower surface is used as the light-extracting surface 41. For example, the growth substrate is disposed on an upper surface side of the light-emitting elements 40. As another form of the light-emitting element 40, the growth substrate may be removed by laser lift-off (LLO) method or the like to expose the semiconductor layer from the upper surface. A protective element may be mounted near the light-emitting element 40.

The light-guiding member 50 is a light-transmissive member that guides light from the light-emitting element 40 to an outside of the light-emitting device 1. The light-guiding member 50 includes the first light-guiding member 51, the wavelength conversion member 60, and the second light-guiding member 52, in order from the light-extracting surface 41 side of the light-emitting element 40 to the light-emission surface 53.

Examples of the overall shape of the light-guiding member 50 include a column shape, a prism shape, a frustum shape, and shapes similar to these shapes. For example, the light-guiding member 50 has an overall shape of a quadrangular prism. In the light-guiding member 50, one surface of the first light-guiding member 51 is employed as the incident surface 51a of the light-guiding member 50. The light-guiding member 50 is covered by the light-reflective member 70 except for the incident surface 51a and the light-emission surface 53 through which light is emitted to the outside.

In the example shown in FIG. 2, the plurality of light-emitting elements 40 are aligned in one direction along a longitudinal direction of the light-guiding member 50, and the light-extracting surface 41 of each of the light-emitting elements 40 is bonded with the first light-guiding member 51. The light-emitting elements 40 and the light-guiding member 50 are integrally covered by the light-reflective member 70. With this arrangement, light emitted from each light-emitting element 40 can be propagated in the light-guiding member 50 toward the light-emission surface 53 while the light-reflective member 70 reflects light toward the inside of the light-guiding member 50.

The light-guiding member 50 is preferably larger than the light-emitting element 40 in a plan view. The light-guiding member 50, in which the incident surface 51a has an area larger than an area of the light-extracting surface 41 of the light-emitting element 40, is optically-connected to the light-emitting element 40. This arrangement allows for reducing optical loss between the incident surface 51a and the light-extracting surface 41.

A surface of the first light-guiding member 51 (e.g., lower surface in FIG. 2) faces the light-extracting surface 41 of each of the light-emitting elements 40, and serves as the incident surface 51a. The incident surface 51a of the first light-guiding member 51 is located over the light-emitting elements 40 to cover the entirety of light-extracting surface 41 of each of the light-emitting elements 40. The first light-guiding member 51 may be disposed on the light-emitting elements 40 via a medium layer such as a transparent adhesive layer disposed therebetween or may be directly bonded with the light-emitting elements 40.

A surface of the first light-guiding member 51 adjacent to the incident surface 51a (e.g., right-side surface in FIG. 2) is bonded with a surface of the wavelength conversion member 60 (e.g., left-side surface in FIG. 2). The incident surface 51a of the first light-guiding member 51 and a lower surface 60a of the wavelength conversion member 60 are disposed adjacent to each other and are disposed in the same plane. The first light-guiding member 51 is covered with the light-reflective member 70 except for the incident surface 51a and a surface bonded with the wavelength conversion member 60.

The first light-guiding member 51 includes a material that transmits at least a portion of light emitted from the light-emitting element 40. Examples of such a material for the first light-guiding member 51 include thermosetting resin materials such as silicone resins, thermoplastic resin materials such as polycarbonates and acrylic resins, and other polymer materials such as polyethylene. Alternatively, examples of the material for the first light-guiding member 51 include optical glass such as quartz, synthetic quartz, and BK7. In the description below, an example in which the first light-guiding member 51 is made of glass is illustrated.

A surface of the wavelength conversion member 60 (e.g., right-side surface in FIG. 2) opposing a surface of the wavelength conversion member 60 bonded with the first light-guiding member 51 is bonded with a surface of the second light-guiding member 52 (e.g., left-side surface in FIG. 2). The lower surface 60a of the wavelength conversion member 60 and a lower surface 52a of the second light-guiding member 52 are adjacent to each other and are in the same plane. The wavelength conversion member 60 is spaced from the light-extracting surface 41 of each of the light-emitting elements 40. With this arrangement, light from the light-emitting elements 40 enters the wavelength conversion member 60 through the first light-guiding member 51. The light-reflective member 70 covers, of wavelength conversion member 60, the lower surface 60a of the, the upper surface opposing the lower surface 60a, and the other surfaces adjacent to the upper surface.

The wavelength conversion member 60 includes a fluorescent material for converting at least a portion of light having the first wavelength emitted from the light-emitting elements 40 into light having a second wavelength, which differs from the first wavelength. Examples of the wavelength conversion member 60 include a sintered body of a fluorescent material, and a resin, glass, and other inorganic materials containing fluorescent material powders. The sintered body of a fluorescent material may be formed by sintering only the fluorescent material or may be formed by sintering mixtures of the fluorescent material and a sintering agent. In the case of sintering a mixture of a fluorescent material and a sintering agent, the sintering agent is preferably an inorganic material such as silicon oxide, aluminum oxide, and titanium oxide. This arrangement allows for preventing changes in the color or the shape of the sintering agent due to light or heat even in the case where high-power light-emitting elements 40 are used.

The higher light transmittance of the wavelength conversion member 60 is, the more easily light can be reflected on the interface between the wavelength conversion member 60 and the light-reflective member 70, and thus the luminance can be increased. For this reason, the wavelength conversion member 60 preferably has a high light transmittance. In view of reliability, the wavelength conversion member 60 is more preferably made of only inorganic materials.

As the fluorescent material contained in the wavelength conversion member 60, any appropriate fluorescent material used in the field of the present invention can be selected. For example, a nitride-based or oxynitride-based fluorescent material activated by a lanthanoid element such as Ce and Eu can be contained. More specifically, for the fluorescent material, for example, a rare-earth aluminate salt activated by a lanthanoid element such as Ce, can be used, and among these materials, a YAG fluorescent material is preferably used. A part of or the entirety of Y in the YAG fluorescent material may be substituted with Tb and/or Lu.

The second light-guiding member 52 includes the light-emission surface 53 (e.g., right-side surface in FIG. 2) opposing the surface of the second light-guiding member 52 bonded with the wavelength conversion member 60. Light from the wavelength conversion member 60 is emitted to the outside through the light-emission surface 53. The second light-guiding member 52 is covered by the light-reflective member 70 except for the light-emission surface 53 and a surface bonded with the wavelength conversion member 60.

The second light-guiding member 52 contains a material that allows light having the first wavelength emitted from the light-emitting elements 40 and light having the second wavelength that has undergone conversion by the wavelength conversion member 60 to pass through. For the second light-guiding member 52, any of the above materials used for the first light-guiding member 51 can be used. The first light-guiding member 51 and the second light-guiding member 52 may be made of the same material or different materials. In the description below, an example in which the second light-guiding member 52 is made of glass is illustrated.

For example, the light-emission surface 53 is perpendicular to the light-extracting surface 41 of the light-emitting element 40. As shown in FIG. 1, the entirety of the outer periphery of the light-emission surface 53 is surrounded by the light-reflective member 70. The light-emission surface 53 preferably has an area smaller than the area of the incident surface 51a. With this arrangement, the intensity of emission of the light-emitting device 1 can be enhanced. For example, in the light-guiding member 50 having an overall shape of a quadrangular prism and having the light-emission surface 53 with a predetermined area, increasing the length of the first light-guiding member 51 in the Z-axis direction, which is the direction in which light from the light-emitting device 1 is emitted, allows for increasing the area of the incident surface 51a. In this case, the luminance can be further enhanced by increasing the number of the light-emitting elements 40 disposed along the first light-guiding member 51 while maintaining the area of the light-emission surface 53.

The light-reflective member 70 integrally covers a periphery of the light-guiding member 50 and a periphery of each of the plurality of light-emitting elements 40. The light-reflective member 70 is configured to reflect light emitted from the light-emitting elements 40 toward the light-guiding member 50. For example, the light-reflective member 70 includes an optical multilayer film 71, a metal layer 72, and a resin member 73 in this order starting from the inner side (i.e., light-guiding member 50 side).

The optical multilayered film 71 covers the light-guiding member 50 and the light-emitting elements 40, and has a function of reflecting light emitted from the light-emitting elements 40 toward the light-guiding member 50. With this arrangement, light emitted from the light-emitting elements 40 is efficiently guided to the light-emission surface 53 through the light-guiding member 50. The optical multilayered film 71 is made of an electrical insulating material. In the optical multilayered film 71, two or more light-transmissive dielectrics having different refractive indices may be layered to constitute a Distributed Bragg Reflector (DBR) film.

The DBR film has a multi-layered structure in which a pair of dielectrics including a low-refractive-index layer and a high-refractive-index layer, are layered in plural so as to selectively reflect light having a predetermined wavelength. More specifically, films having different refractive indices are alternately stacked with an optical thickness of, for example, one-fourth of the emission peak wavelength of light from the active layer, which can efficiently reflect light in a region centered at the emission peak wavelength. A material of the DBR film is preferably selected from oxides and nitrides of at least one metal selected from the group consisting of Si, Ti, Zr, Nb, Ta, and Al. In the case where the DBR is made of an oxide film, the low-refractive-index layer is made of, for example, $SiO_2$. In this case, the high-refractive-index layer is formed of, for example, $Nb_2O_5$, $TiO_2$, $ZrO_2$, or $Ta_2O_5$.

The optical multilayer film 71 can be formed by, for example, atomic layer deposition (ALD) method, a sputtering method, or a vapor deposition method. Among these methods, ALD method allows for forming a dense film, covering a surface having irregularities such as a step with high covering performance, and forming a film having a uniform thickness, and thus is preferable. Using ALD method allows for forming a film in all directions, so that the optical multilayered film 71 having a uniform thickness can be layered also on the lower side of the light-guiding member 50, on which forming a film by sputtering is difficult. In addition, for example, the optical multilayer film 71 having a uniform thickness can be formed at atomic level on the periphery of each of the light-emitting elements 40, a periphery of each of the bumps 30, an upper surface and a periphery of each of the electrically conductive wirings 20, and the upper surface of the supporting member 10. As described above, the optical multilayered film 71 can also serve as an insulating member that electrically insulates between the positive and negative electrodes of each of the light-emitting elements 40, that is, between a pair of bumps 30. With this arrangement, the structure of the light-emitting device 1 can be simplified, and the number of steps in the manufacturing procedure can be reduced.

The metal layer 72 covers the optical multilayered film 71. Since the optical multilayered film 71 covers and insulates the light-emitting elements 40 and the electrically conductive wirings 20 as described above, the electrically-conductive metal layer 72 can be additionally formed. The metal layer 72 is configured such that electric current is not flown thereto. The metal layer 72 is made of, for example, Au, Ag, Al, Pt, Rh, or Ir, or an alloy whose main component is one or more of these metals. Among these materials, a metal such as Au, Ag, and Al or alloy having a high light reflectance is preferably used.

The metal layer 72 is formed on the optical multilayer film 71, so that light that has traveled through the light-guiding member 50 and the optical multilayer film 71 can be reflected. With the combination of the optical multilayer film 71 and the metal layer 72, incident light can be efficiently reflected. The metal layer 72 can be formed by, for example, ALD method, a sputtering method, or a vapor deposition method. Arrangement of the metal layer 72 allows for reducing thickness of the resin member 73 that covers the metal layer 72.

The resin member 73 is disposed so as to cover at least a portion of the metal layer 72 and to expose the light-emission surface 53 of the light-guiding member 50. For example, a thermoplastic resin or a thermosetting resin can be used for the resin member 73. In the case of using a thermoplastic resin, for example, polyphthalamide resin, a liquid crystal polymer, polybutylene terephthalate (PBT), or an unsaturated polyester can be used. In the case of using a thermosetting resin, for example, an epoxy resin, a modified epoxy resin, a silicone resin, or a modified silicone resin can be used.

The resin member 73 preferably contains a light-reflective substance. Examples of such light-reflective substance include titanium oxide, zinc oxide, zirconium oxide, silicon oxide, magnesium oxide, antimony oxide, aluminum hydroxide, barium sulfate, magnesium carbonate, barium carbonate, potassium titanate, alumina, aluminum nitride, boron nitride, and glass fillers.

As described above, the light-emitting device 1 includes the light-guiding member 50 including the first light-guiding member 51, the wavelength conversion member 60, and the second light-guiding member 52, in this order. In the light-emitting device 1, the light-reflective member 70 covers the light-guiding member 50 and the light-emitting elements 40 integrally, and the light-emission surface 53 of the light-guiding member 50 is exposed from the light-reflective member 70. With this arrangement, light emitted from the light-emitting element 40 is reflected by the light-reflective member 70, passes through the wavelength conversion member 60 in the light-guiding member 50, and is emitted to the outside through the light-emission surface 53.

Further, with the light-emitting device 1 including the light-guiding member 50 having the above structure, light emitted from the light-emitting element 40 can be narrowed down before the light passes through the wavelength conversion member 60. Accordingly, in the path of light from the light-emitting element 40 to the light-emission surface 53, light scattered within the wavelength conversion member 60 is reduced compared with a conventional technique in which light is narrowed down after the light passes through the wavelength conversion member. Thus, the light-emitting device 1 having good light extraction efficiency can be provided.

Method of Manufacturing Light-Emitting Device 1

A method of manufacturing the light-emitting device 1 according to the first embodiment will be described. The method of manufacturing the light-emitting device 1 includes providing the light-guiding member 50 that includes the first light-guiding member 51, the wavelength conversion member 60, and the second light-guiding member 52 in this order, bonding the first light-guiding member 51 with the light-emitting element 40, covering the light-emitting element 40 and the light-guiding member 50 with the light-reflective member 70, and exposing a portion of a surface of the second light-guiding member 52 from the light-reflective member 70 to serve as the light-emission surface 53 of the light-guiding member 50.

In the step of providing the light-guiding member 50, the light-guiding member 50 in which the first light-guiding member 51, the wavelength conversion member 60, and the second light-guiding member 52 are disposed in this order can be formed by, for example, bonding the first light-guiding member 51 to one lateral surface of the plate-shaped wavelength conversion member 60 and bonding the second light-guiding member 52 to another lateral surface of the wavelength conversion member 60.

In the description below, the step of providing a plurality of quadrangular-prism light-guiding members 50, as an example, is illustrated referring to FIG. 3A to FIG. 3C.

First, a wavelength conversion member 60A, a first light-guiding member 51A, and a second light-guiding member 52A are provided. For the wavelength conversion member 60A, for example, a plate-shaped sintered body of a YAG fluorescent material is used. For each of the first light-guiding member 51A and the second light-guiding member 52A, for example, a glass block is used. The dimension of each of the wavelength conversion member 60A and the glass block is determined in advance in view of the dimensions and the number of the light-guiding members 50 to be obtained.

As shown in FIG. 3A, a light-guiding member block 50A is formed by bonding the first light-guiding member 51A with one lateral surface of the wavelength conversion member 60A and bonding the second light-guiding member 52A to another lateral surface of the wavelength conversion member 60A opposing the lateral surface of the wavelength conversion member 60A bonded with the first light-guiding member 51A. In FIG. 3A, a height of the light-guiding member block 50A in a direction including the first light-guiding member 51A, the wavelength conversion member 60A, and the second light-guiding member 52A corresponds to the length of the light-guiding member 50 in the longitudinal direction (Z-axis direction) in a cross-sectional view including the first light-guiding member 51, the wavelength conversion member 60, and the second light-guiding member 52.

The wavelength conversion member 60A may be bonded with the first light-guiding member 51A or the second light-guiding member 52A via a medium layer such as a transparent adhesive layer disposed therebetween. Alternatively, the wavelength conversion member 60A may be directly bonded with the first light-guiding member 51A and the second light-guiding member 52A using the wavelength conversion member 60A itself as a member for bonding the first light-guiding member 51A to the second light-guiding member 52A.

For example, the wavelength conversion member 60A is directly bonded with the first light-guiding member 51A and the second light-guiding member 52A by direct bonding. The expression "directly bonded" above refers to that surfaces to be bonded are bonded to each other by using bonding of atoms without adhesives. For such a direct bonding, a bonding technique generally classified as a room-temperature bonding is preferably employed.

Examples of a direct-bonding technique suitable for the present embodiment include surface-activated bonding, atomic diffusion bonding, and hydroxy-group bonding. In surface-activated bonding, surfaces to be bonded are irradiated with inert ions in ultra-high vacuum, which can clean and activate the surfaces, and the surfaces are bonded to each other. In atomic diffusion bonding, metal films are formed by sputtering in ultra-high vacuum, and bonding is achieved by diffusion of the metals of the metal films. It is observed that greatly reducing the thickness of a film formed by sputtering allows for performing bonding so as not to affect the light extraction. In hydroxy-group bonding, hydroxy groups are formed on surfaces to be bonded, and bonding is achieved by hydrogen bonding of the hydroxy groups.

In the above three types of room-temperature bonding, bonding force may be enhanced by performing heat treatment as appropriate. In this case, heating may be performed at equal to or less than 400° C., preferably equal to or less than 300° C., more preferably equal to or less than 200° C.

Figure 3B:
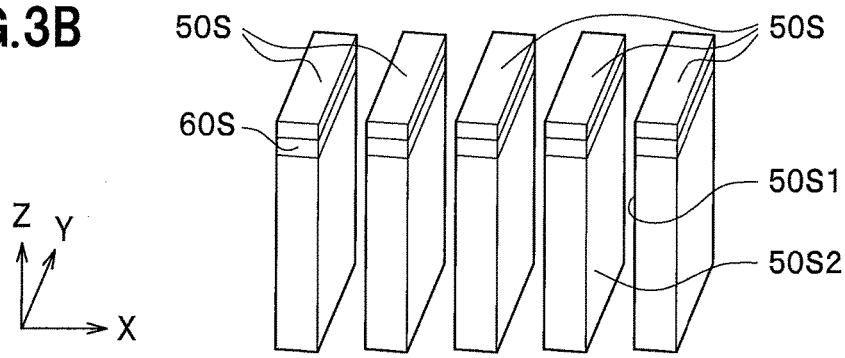
FIG. 3B is a schematic perspective view of light-guiding member plates for schematically illustrating an operation in the manufacturing of the light-emitting device according to the first embodiment.
Figure 3C:
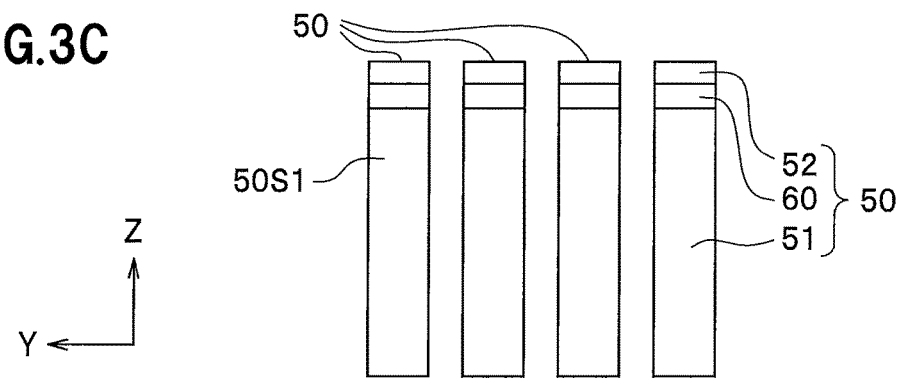
FIG. 3C is a schematic plan view of light-guiding members for schematically illustrating an operation in the manufacturing of the light-emitting device according to the first embodiment.

Next, the light-guiding member block 50A is divided at every predetermined first width to form a plurality of light-guiding member plates 50S, as shown in FIG. 3B. In this case, the light-guiding member block 50A is divided at a location including the first light-guiding member 51, the wavelength conversion member 60, and the second light-guiding member 52 along one direction (i.e., direction parallel to the Y-Z plane). The predetermined first width corresponds to the height of the light-guiding member 50 in the cross-sectional view shown in FIG. 2. In this manner, the plurality of light-guiding member plates 50S each includes the first light-guiding member 51, the wavelength conversion member 60, and the second light-guiding member 52 in this order are formed as intermediate members. The wavelength conversion member in each light-guiding member plate 50S is referred to as a wavelength conversion member 60S.

Subsequently, the two surfaces of the light-guiding member plate 50S opposing each other are, for example, polished to form a pair of smooth polished surfaces 50S1 and 50S2 on front and back surfaces of the light-guiding member plate 50S, respectively.

Next, after the light-guiding member block 50A is divided, the light-guiding member plate 50S is further divided at every predetermined second width. As shown in FIG. 3C, the polished surface 50S1 of the light-guiding member 50 corresponds to the lower surface of the light-guiding member 50 in the cross-sectional view shown in FIG. 2. The predetermined second width corresponds to the depth (i.e., length in the Y-axis direction) of the light-guiding member 50 in a cross-sectional view. The direction in which each of the light-guiding member plates 50S is divided (i.e., direction parallel to the Z-X plane) is perpendicular to the direction in which the light-guiding member block 50A is divided (direction parallel to the Y-Z plane). In the order described above, the light-guiding member 50 having an elongated substantially quadrangular-prism shape can be formed by the above procedure.

Dividing of the light-guiding member block 50A and the light-guiding member plate 50S can be performed with, for example, a blade or a laser.

In the above description, the light-guiding member block 50A shown in FIG. 3A is formed first, but the light-guiding member plate 50S shown in FIG. 3B can be formed first instead. Dividing the light-guiding member plate 50S at every predetermined second width can provide a plurality of light-guiding members 50. In this case, both of front and back surfaces are preferably polished before or after dividing.

Figure 3D:
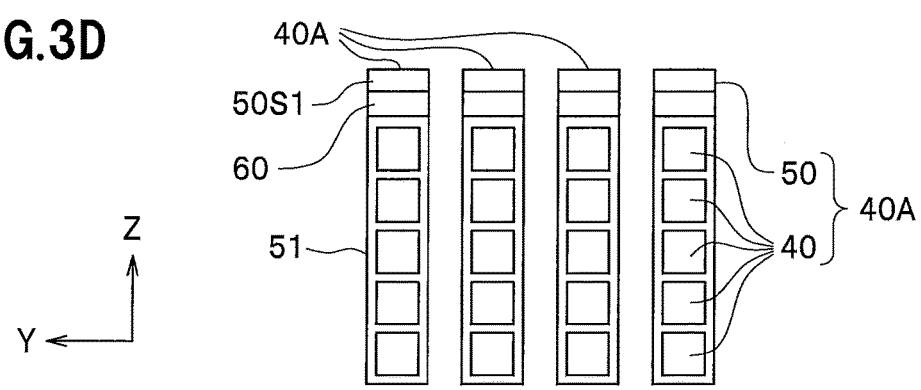
FIG. 3D is a schematic plan view of light-emitting elements bonded to the light-guiding members for schematically illustrating an operation in the manufacturing of the light-emitting device according to the first embodiment.

Next, the step of bonding the first light-guiding member 51 to the light-emitting element 40 will be described referring to FIG. 3D. As shown in FIG. 3D, the polished surface 50S1 of the light-guiding member 50 corresponds to the lower surface of the light-guiding member 50 in the cross-sectional view shown in FIG. 2.

As the light-emitting elements 40, LED chips are provided in advance, each in which an n-side semiconductor layer, an active region, a p-side semiconductor layer, an n-electrode, a p-electrode, a predetermined protective film layer, and the like are layered on a growth substrate. The light-emitting elements 40 may be formed of a nitride semiconductor such as GaN. For the growth substrate, for example, a single-crystal sapphire substrate is used.

In the light-guiding member 50, a plurality of light-emitting elements 40 are bonded to a portion of the polished surface 50S1 corresponding to the surface of the first light-guiding member 51, as shown in FIG. 3D. In other words, in the polished surface 50S1, the surface of the first light-guiding member 51 on which the light-emitting elements 40 are to be bonded serves as the incident surface 51a (FIG. 2). The wavelength conversion member 60 is spaced from the light-emitting elements 40 so that light from the light-emitting elements 40 does not directly enter the wavelength conversion member 60. That is, the first light-guiding member 51 is disposed between the light-emitting elements 40 and the wavelength conversion member 60, and light from the light-emitting elements 40 enters the wavelength conversion member 60 through the first light-guiding member 51.

The light-emitting elements 40 may be disposed on the first light-guiding member 51 via any kind of a medium layer such as a transparent adhesive layer disposed therebetween or may be directly bonded to the first light-guiding member 51. In the description below, the light-emitting elements 40 and the light-guiding member 51 bonded with each other are referred to as a "light-emitting element assembly 40A". The light-emitting element assembly 40A includes the plurality of light-emitting elements 40 aligned at a predetermined interval along the longitudinal direction (i.e., Z-axis direction) of the light-guiding member 50.

Figure 4A:
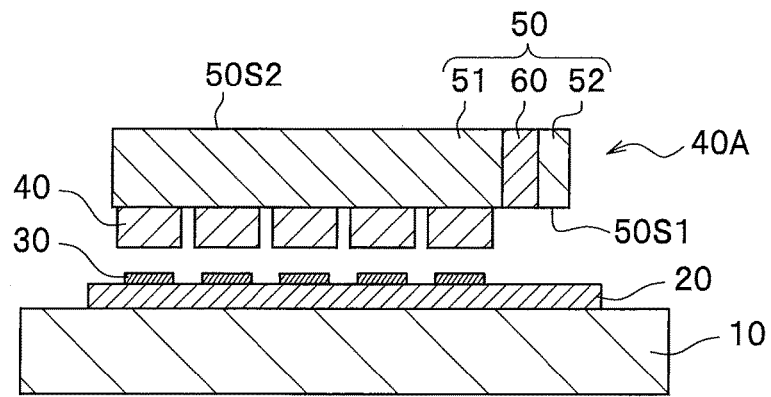
FIG. 4A is a schematic cross-sectional view of the light-emitting elements bonded to the light-guiding member for schematically illustrating an operation in the manufacturing of the light-emitting device according to the first embodiment.

Next, the step of mounting the light-emitting elements 40 on the supporting member 10 will be described referring to FIG. 4A. With the light-guiding member 50 facing upward, the light-emitting element assembly 40A is mounted on the supporting member 10 so that the electrodes of each of the light-emitting elements 40 faces the supporting member 10. Each of the electrodes of each of the light-emitting elements 40 is electrically connected to respective one of the electrically conductive wirings 20 included in the supporting member 10 via each of the bumps 30 or the like. For ease of explanation, the light-emitting elements 40 shown are spaced from the electrically conductive wirings 20, but each of the light-emitting elements 40 is secured to respective one of the electrically conductive wirings 20 via each of the bumps 30.

Each of the light-emitting elements 40 is an LED chip, and has positive and negative electrodes on the same surface side. Each of the electrodes of each of the LED chips faces respective one of the positive and negative electrically conductive wirings 20 and is electrically and mechanically connected to respective one of the electrically conductive wirings 20 through the bumps 30. The bumps 30, which are made of gold, solder, or the like, may be formed on the electrically conductive wirings 20 by plating or vapor deposition. Alternatively, the bumps 30 may be formed in advance on an electrode side of the light-emitting elements 40.

Next, covering the light-emitting elements 40 and the light-guiding member 50 with the light-reflective member 70 will be described referring to FIG. 4B to FIG. 4D.

Figure 4B:
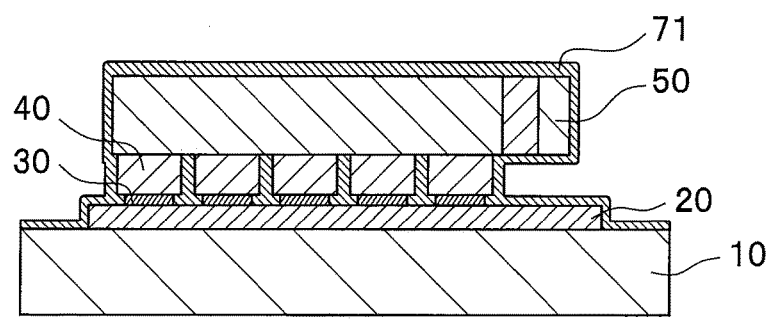
FIG. 4B is a schematic cross-sectional view of the light-guiding member and the light-emitting elements covered by an optical multilayered film for schematically illustrating an operation in the manufacturing of the light-emitting device according to the first embodiment.

First, using ALD method, a surface of the light-guiding member 50, the periphery of each of the light-emitting elements 40, the upper surface of the supporting member 10, the electrically conductive wirings 20, and the bumps 30 are covered by the light-reflective optical multilayered film 71 as shown in FIG. 4B. In FIG. 4B to FIG. 4D, an end surface of the light-guiding member 50 to be the light-emission surface 53 (see FIG. 1) is also covered with the light-reflective member 70 such as the optical multilayered film 71, but the light-reflective member 70 is partially removed in the next step so that the light-emission surface 53 is exposed. The at least one opening 70a of the light-reflective member 70 as shown in FIG. 1 is formed by disposing a mask on corresponding portions of the electrically conductive wirings 20, forming the light-reflective member 70 such as the optical multilayered film 71, and then removing the mask.

Figure 4C:
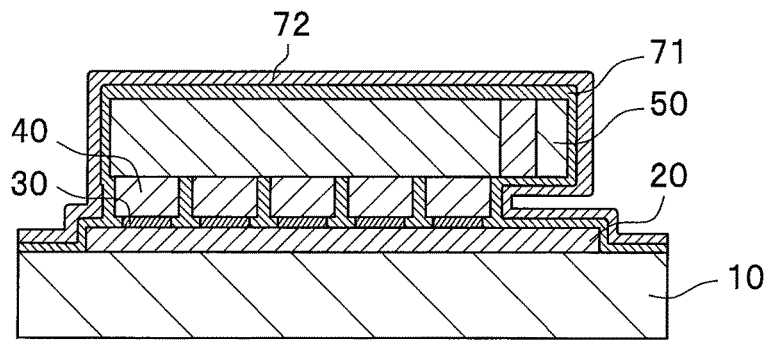
FIG. 4C is a schematic cross-sectional view of the light-guiding member and the light-emitting elements on which a metal layer is formed for schematically illustrating an operation in the manufacturing of the light-emitting device according to the first embodiment.

Next, as shown in FIG. 4C, the metal layer 72 is formed in a predetermined region over the optical multilayer film 71. The metal layer 72 can be formed using the above-described metal such as Au, Ag, or Al or alloy having a high light reflectance by, for example, ALD method.

Figure 4D:
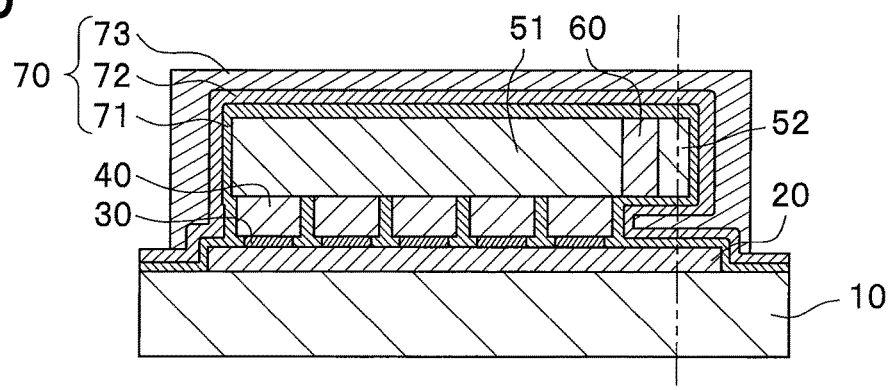
FIG. 4D is a schematic cross-sectional view of the light-guiding member and the light-emitting elements covered by a resin member for schematically illustrating an operation in the manufacturing of the light-emitting device according to the first embodiment.

Next, as shown in FIG. 4D, the light-reflective resin member 73 is disposed to cover the optical multilayered film 71 and the metal layer 72. For a method of forming the resin member 73, a general method such as potting, compression molding, transfer molding, or injection molding can be employed. Heat is then applied, which cures the resin member 73. Accordingly, the light-guiding member 50 is sealed by the light-reflective member 70.

Next, the step of exposing a portion of a surface of the second light-guiding member 52 from the light-reflective member 70 will be described referring to FIG. 4D. After the light-guiding member 50 is sealed by the light-reflective member 70, a portion of each of the light-reflective member 70 and the second light-guiding member 52 is removed at a position (position indicated by the imaginary line in FIG. 4D) including the second light-guiding member 52. Such removing is performed by, for example, cutting with a blade, cutting with a laser, or polishing. With this, a portion of the surface of the second light-guiding member 52 is exposed from the light-reflective member 70, so that the light-emission surface 53 is formed.

With the method of manufacturing a light-emitting device according to the embodiment of the present disclosure, the light-emitting device 1 can be manufactured in which optical loss within the wavelength conversion member 60 is reduced through such a manufacturing procedure.

In the description below, effect obtained from the light-guiding member 50 including the second light-guiding member 52 in view of the method of manufacturing the light emitting device is illustrated. If the second light-guiding member 52 is not disposed, the wavelength conversion member 60 is needed to be cut or polished in the step of removing a portion of the light-reflective member 70. Accordingly, the size of the wavelength conversion member 60 may be varied due to cutting or polishing. Further, the variation in size of the wavelength conversion member 60 may cause variation in the chromaticity of the light-emitting device that includes the wavelength conversion member 60.

On the other hand, in the method of manufacturing a light-emitting device according to certain embodiments of the present disclosure, not the wavelength conversion member 60 but the second light-guiding member 52 is cut or polished. Accordingly, the size of the wavelength conversion member 60 is not changed, and the second light-guiding member 52 is made of a light-transmissive material such as glass. With this arrangement, the above problem can be prevented almost without affecting the chromaticity.

Second Embodiment

Structure of Light-Emitting Device 1B

Next, a light-emitting device 1B according to a second embodiment will be described referring to FIG. 5.

The light-emitting device 1B differs from the light-emitting device 1 in that the upper surface of the second light-guiding member 52B serves as a light-emission surface 53B of the second light-guiding member 52B. That is, in the light-emitting device 1B, the light-emission surface 53B faces in the same direction (X-axis direction) as the direction in which the light-extracting surfaces 41 of the light-emitting elements 40 face. In the below description, elements that are the same as those of the light-emitting device 1 are indicated by the same reference numerals, and their descriptions are omitted.

The light-emitting device 1B includes a supporting member 10, electrically conductive wirings 20, light-emitting elements 40, a light-guiding member 50B, and a light-reflective member 70B.

The light-guiding member 50B includes the first light-guiding member 51, a wavelength conversion member 60, and the second light-guiding member 52B in this order. For example, the light-guiding member 50B has a shape in which a portion of a quadrangular prism is removed. More specifically, the second light-guiding member 52B has an inclined surface 54 inclined with respect to the light-extracting surface 41 of each of the light-emitting elements 40, which is different from the shape of the second light-guiding member 52.

The second light-guiding member 52B has the inclined surface 54 inclined with respect to the light-extracting surface 41 of each of the light-emitting elements 40. The inclined angle of the inclined surface 54 shown in FIG. 5 is 45° with respect to the light-extracting surfaces 41, but may be any appropriate angle larger than 0° with respect to the light-extracting surface 41. Increasing the inclined angle allows for decreasing the area of the light-emission surface 53B, so that, for example, the inclined angle is preferably in a range of 30° to 60° with respect to the light-extracting surface 41.

A surface (i.e., upper surface in FIG. 5) of the second light-guiding member 52B connected to the inclined surface 54 is exposed from the light-reflective member 70B to serve as the light-emission surface 53B. The light-emission surface 53B has an area smaller than an area of the incident surface 51a of the first light-guiding member 51. For example, the area of the light-emission surface 53B is substantially the same as the area of a cross-section of the wavelength conversion member 60 through which light emitted from the light-emitting elements 40 passes.

The light-reflective member 70B has a simplified structure with respect to the light-reflective member 70 shown in FIG. 1 in view of not including the metal layer 72, and differs from the light-reflective member 70 in the shape of the resin member 73. That is, the light-reflective member 70B includes an optical multilayered film 71 and a resin member 73, and the resin member 73 has an inclined surface 74 facing the inclined surface 54 of the second light-guiding member 52B as shown in FIG. 5.

Also, with the light-emitting device 1B, light emitted from the light-emitting elements 40 can be narrowed down before the light passes through the wavelength conversion member 60. With this arrangement, in the path of light from the light-emitting elements 40 to the light-emission surface 53B, light scattered in the wavelength conversion member 60 is reduced compared with a conventional technique in which light is narrowed down after the light passes through the wavelength conversion member. Accordingly, the light-emitting device 1B having good light extraction efficiency can be provided.

Method of Manufacturing Light-Emitting Device 1B

A method of manufacturing the light-emitting device 1B according to the second embodiment will be described. The method of manufacturing the light-emitting device 1B differs from the method of manufacturing the light-emitting device 1 in the step of providing a plurality of light-guiding members 50B and in the step of exposing a portion of the surface of the second light-guiding member 52B.

Figure 6A:
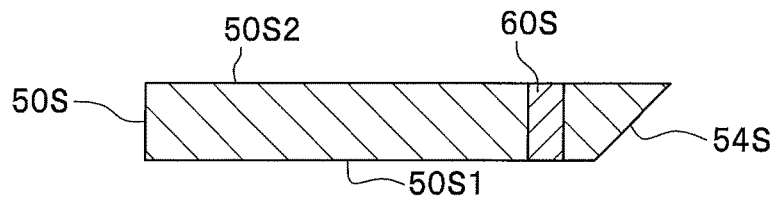
FIG. 6A is a schematic cross-sectional view of a light-guiding member for schematically illustrating an operation in a manufacturing of the light-emitting device according to the second embodiment.
Figure 6B:
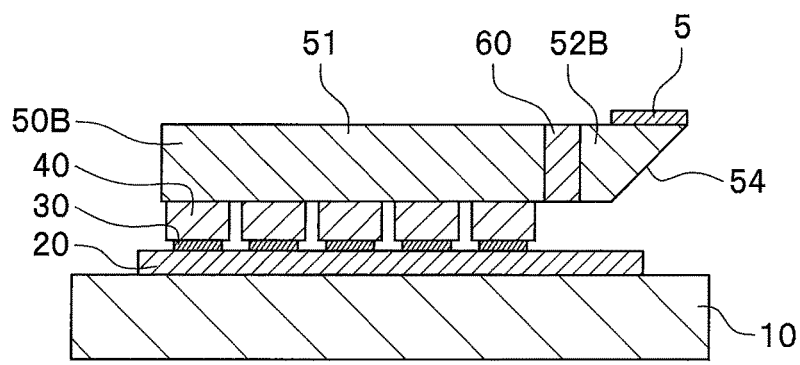
FIG. 6B is a schematic cross-sectional view of the light-guiding member on which a resist has been formed and the light-emitting elements for schematically illustrating an operation in the manufacturing of the light-emitting device according to the second embodiment.

The step of providing a plurality of light-guiding members 50B will be described referring to FIG. 6A and FIG. 6B.

First, an end surface of the second light-guiding member 52 in each of a plurality of light-guiding member plates 50S provided is processed so that the end surface is inclined with respect to the surfaces 50S1 and 50S2 prior to polishing. One of the surfaces 50S1 and 50S2 will be a bonding surface between the light-emitting elements 40 and the first light-guiding member 51 in a later step. In other words, in this step, the end surface of the second light-guiding member 52 is processed so that the end surface is inclined with respect to the surface of the first light-guiding member 51 to be bonded with the light-emitting elements 40, so that the inclined surface 54 (shown in FIG. 6B) is formed. Accordingly, the second light-guiding member 52B (shown in FIG. 6B) is formed. As shown in FIG. 6A, an inclined surface 54S of each light-guiding member plate 50S is formed so that a surface of the light-guiding member plate 50S to which the light-emitting elements 40 will be bonded in a later step has an area smaller than its opposite surface of the light-guiding member plate 50S.

More specifically, for example, using a blade, a portion of the end surface of the second light-guiding member 52 in the light-guiding member plate 50S is cut, so that the inclined surface 54S is formed. It is preferable that the inclined surface 54S be polished to be a smooth surface when the polished surfaces 50S1 and 50S2 are formed. The light-emitting elements 40 are bonded to the polished surface 50S1 side of the light-guiding member plate 50S in this case. Accordingly, the inclined surface 54S is formed so that the polished surface 50S1 has an area smaller that than an area of the polished surface 50S2.

Next, each light-guiding member plate 50S having the inclined surface 54S is divided at every predetermined second width to provide a plurality of light-guiding members 50B each having an elongated shape (shown in FIG. 6B) in each of which the first light-guiding member 51, the wavelength conversion member 60, and the second light-guiding member 52B are disposed in this order. The light-guiding member 50B is different from the light-guiding member 50 shown in FIG. 3C in that the light-guiding member 50B has the inclined surface 54.

In the method of manufacturing the light-emitting device 1B, the step of bonding the first light-guiding member 51 of the light-guiding member 50B to the light-emitting elements 40 is substantially the same as the corresponding step described above in the method of manufacturing the light-emitting device 1, and thus its description is omitted.

Next, the step of mounting the light-emitting elements 40 on the supporting member 10 is substantially the same as the corresponding step described above in the method of manufacturing the light-emitting device 1, and thus its description is omitted.

Next, the step of covering the light-emitting elements 40 and the light-guiding member 50B with the light-reflective member 70B will be described referring to FIG. 6B to FIG. 6D.

For example, for preparation of covering the light-emitting elements 40 and the light-guiding member 50B with the light-reflective member 70B, a mask is formed to protect a region in which the light-emission surface 53B is to be formed. The light-emission surface 53B is to be formed on a portion of the upper surface of the second light-guiding member 52B connected to the inclined surface 54 in the light-guiding member 50B. In the present embodiment, a resist 5 is formed as the mask on a portion of the upper surface of the second light-guiding member 52B as shown in FIG. 6B by a known method. The resist 5 is preferably spaced from at least one edge of the second light-guiding member 52B in a plan view. In order to narrow down the area of the light-emission surface 53B, the resist 5 is preferably spaced from all the edges of the second light-guiding member 52B in a plan view.

Figure 6C:
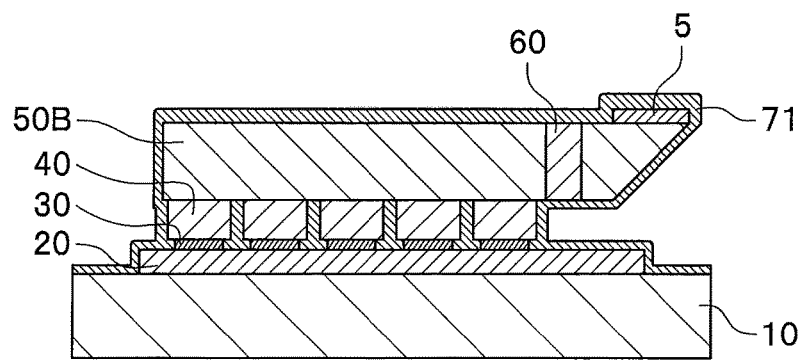
FIG. 6C is a schematic cross-sectional view of the light-guiding member and the light-emitting elements covered with the optical multilayer film for schematically illustrating an operation in the manufacturing of the light-emitting device according to the second embodiment.

Next, using ALD method, the surfaces of the light-guiding member 50B, the peripheries of the light-emitting elements 40, and the like are covered with the optical multilayer film 71 having an approximately uniform thickness as shown in FIG. 6C over the resist 5. With this, light leakage from the inclined surface 54 can be reduced.

Figure 6D:
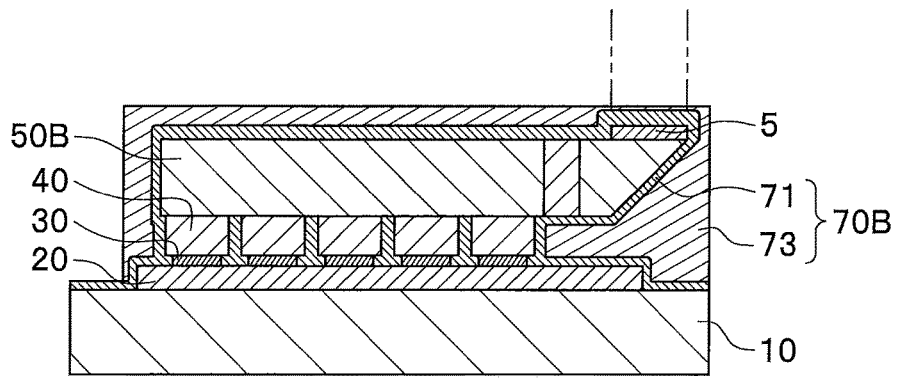
FIG. 6D is a schematic cross-sectional view of the light-guiding member and the light-emitting elements covered with the resin member for schematically illustrating an operation in the manufacturing of the light-emitting device according to the second embodiment.

Next, the light-reflective resin member 73 is disposed to cover at least a portion of the optical multilayered film 71 and cured, as shown in FIG. 6D. In this step, the resin member 73 is disposed to cover the optical multilayered film 71 covering the inclined surface 54 of the light-guiding member 50B. With this arrangement, light leakage from the inclined surface 54 can be reduced more effectively.

Next, the step of exposing a portion of a surface of the second light-guiding member 52B will be described referring to FIG. 6D. After the light-guiding member 50B and the like are sealed by the light-reflective member 70B, the resist 5 and a portion of the light-reflective member 70B disposed above the resist 5, which are indicated by imaginary lines in FIG. 6D, are removed. For example, the resist 5 can be removed by washing with a strong alkaline solution such as sodium hydroxide in the case of employing wet processing. Alternatively, removal can be performed with a dedicated resist stripping device (ashing device) in the case of employing dry processing.

By removing the resist 5, a portion of the surface of the second light-guiding member 52B is exposed from the light-reflective member 70B, so that the light-emission surface 53B is formed. Accordingly, the light-reflective member 70B thus has a shape surrounding the entire outer periphery of the light-emission surface 53B in a plan view. The light-emitting device 1B is provided through such steps of manufacturing.

Third Embodiment

Figure 7A:
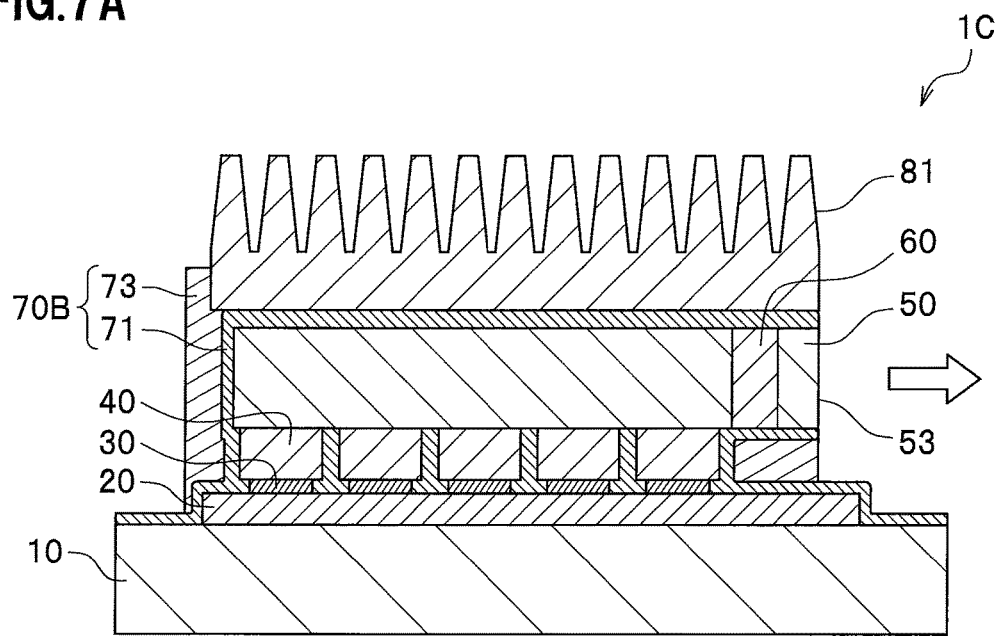
FIG. 7A is a schematic cross-sectional view showing an example of a light-emitting device according to a third embodiment.

Next, a light-emitting device 1C according to a third embodiment will be described referring to FIG. 7A.

The light-emitting device 1C differs from the light-emitting device 1 in that the light-emitting device 1C includes a light-reflective member 70B and a heatsink 81. The light-reflective member 70B is the same as the light-reflective member 70B included in the light-emitting device 1B. In the following description, the same constitutions of the light-emitting device 1 represented by the same reference numerals, and their descriptions are omitted.

The light-emitting device 1C includes a supporting member 10, electrically conductive wirings 20, a light-emitting element 40, a light-guiding member 50, the light-reflective member 70B, and the heatsink 81.

The heatsink 81 is disposed above the light-guiding member 50 in a region in which the light-emitting elements 40 are not disposed. For example, the heatsink 81 is disposed on an upper surface of the light-guiding member 50. In the case where the light-guiding member 50 has a quadrangular-prism shape, the heatsink 81 may be disposed on another lateral surface of the quadrangular prism, or may be disposed on a surface of the quadrangular prism opposite to the light-emission surface 53. For example, the heatsink 81 may be bonded to the light-guiding member 50 or may be bonded to the light-reflective member 70B. In the case where the heatsink 81 is bonded to the light-reflective member 70B, the heatsink 81 may be bonded to the optical multilayered film 71 as shown in FIG. 7A.

Examples of a material for the heatsink 81 include materials having high thermal conductivities such as Cu, Al, Au, Ag, W, Fe, and Ni, alloys such as Al alloys, Ni alloys, phosphor bronze, and stainless steel, and AlN. The heatsink 81 may have a plate-like shape. Alternatively, the heatsink 81 may have a shape having fins in which protrusions and depressions are disposed at an outer periphery as shown in the FIG. 7A to increase the surface area, which allows for easily releasing heat to the outside.

Bonding of the heatsink 81 can be performed before or after the light-reflective member 70B is formed. Further, bonding of the heatsink 81 is preferably performed before or after the resin member 73 is formed. For example, in a method in which the bonding is performed after the resin member 73 is formed, a portion to which the heatsink 81 is to be bonded in a later step is masked, the resin member 73 is formed over the masked portion, and then the mask is removed, so that bonding of the heatsink 81 is performed.

In the light-emitting device 1C, the heatsink 81 is bonded to the light-guiding member 50 directly or via the light-reflective member 70B, so that heat generated in the wavelength conversion member 60 of the light-guiding member 50 can be efficiently released. Thus, the light-emitting device 1C with a high heat dissipation efficiency can be obtained.

Figure 7B:
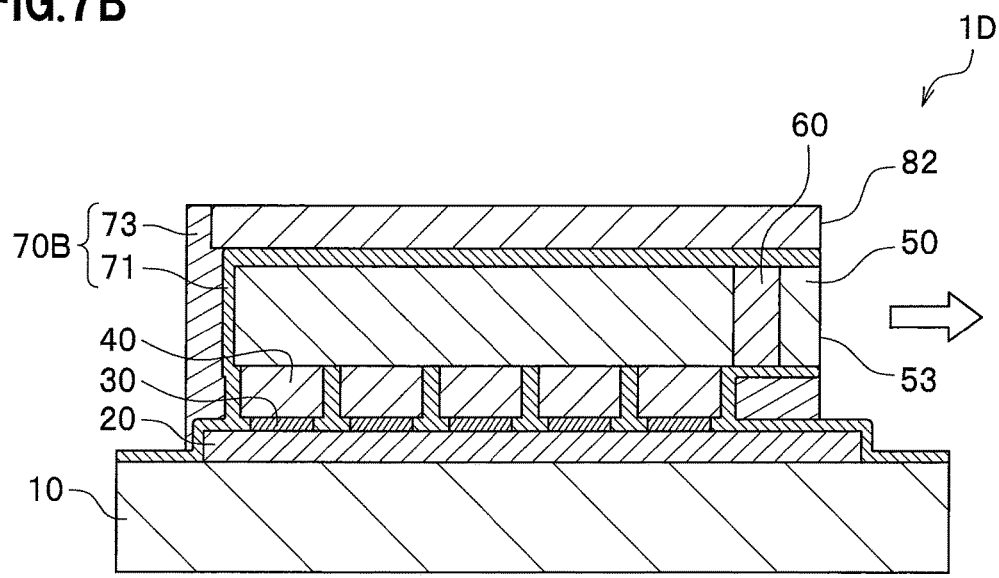
FIG. 7B is a schematic cross-sectional view showing a variant example of the light-emitting device according to the third embodiment.

As a variant example of the light-emitting device according to the third embodiment, the heatsink 81 can be made of a light-reflective material. As shown in FIG. 7B, a light-emitting device 1D may include a metal plate 82 in place of the heatsink 81.

For example, for the metal plate 82, a plate of any of the above materials having high thermal conductivity plated with a metal having a high light reflectance such as Au, Ag, Al, and Cu, may be used. Using a material having a high light reflectance for the metal plate 82 allows the metal plate 72 to more efficiently reflect light from the light-emitting elements 40. Bonding of the metal plate 82 can be performed by a method similar to that of the heatsink 81.

Using a material having a high light reflectance for the metal plate 82 in the light-emitting device 1D allows light from the light-emitting elements 40 to be efficiently reflected on the surface of the metal plate 82. Thus, the light-emitting device 1D with a higher luminance can be obtained.

Fourth Embodiment

An optical element may be further provided in the light-emitting device according to each of the above embodiments.

Figure 8A:
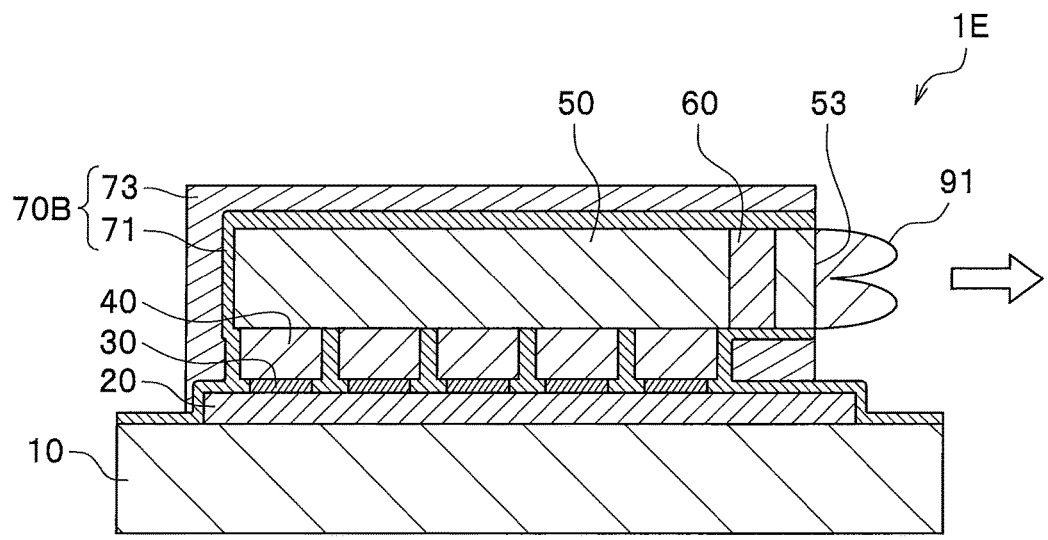
FIG. 8A is a schematic cross-sectional view showing an example of a light-emitting device according to a fourth embodiment.

As shown in FIG. 8A, a light-emitting device 1E has a structure in which an optical element 91 is bonded to the light-emission surface 53 of the light-guiding member 50 of the light-emitting device 1.

Figure 8B:
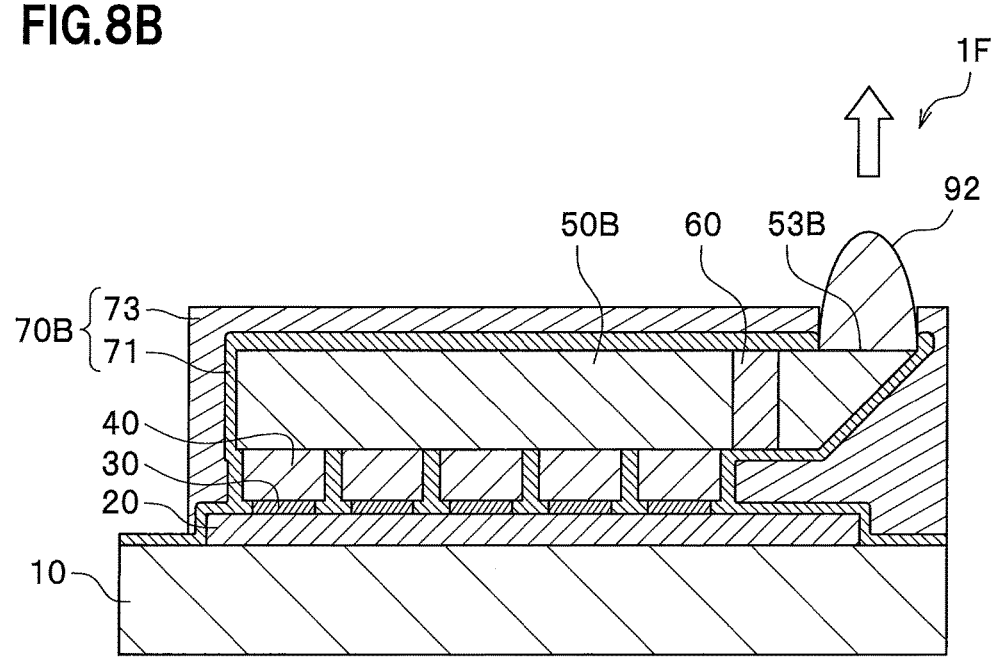
FIG. 8B is a schematic cross-sectional view showing another example of the light-emitting device according to the fourth embodiment.

As shown in FIG. 8B, a light-emitting device 1F has a structure in which an optical element 92 is bonded to the light-emission surface 53B of the light-guiding member 50B of the light-emitting device 1B.

The optical elements 91 and 92 may each have a desired shape such as a hemispherical shape, a shape having a convex curve that is deformed from a spherical shape, a shell shape, or the like to function as a lens for condensing or diffusing light. For example, the optical element 91 has a shape having a concave curve and has a surface in which two convex curved surfaces are continuously aligned in a cross-sectional view.

The optical elements 91 and 92 each includes a light-transmissive member. Examples of the light-transmissive member include thermosetting resin materials such as silicone resins, thermoplastic resin materials such as polycarbonates and acrylic resins, other polymer materials such as polyethylene, and an optical glass.

The optical element 91 and 92 may be bonded to the light-emission surface 53 and 53B, respectively, with a medium layer such as a transparent adhesive layer disposed therebetween, or may be directly bonded to the light-emission surface 53 and 53B, respectively.

With the optical elements 91 and 92, light distribution characteristics of the light-emitting devices 1E and 1F having the above configurations can be controlled.

In the description above, the light-emitting devices according to certain embodiments of the present disclosure is illustrated, but the scope of the present invention is not limited to these descriptions and should be broadly interpreted on the basis of the claims. Needless to say, the scope of the present invention also includes various modifications based on these descriptions.

For example, in the method of manufacturing the light-emitting device 1 in the description above, the smooth polished surfaces 50S1 and 50S2 are provided on two opposing sides of the light-guiding member plate 50S before the light-guiding member plate 50S is divided at every predetermined second width, but the light-guiding member plate 50S may be divided at every predetermined second width and then the surfaces may be polished.

Figure 9:
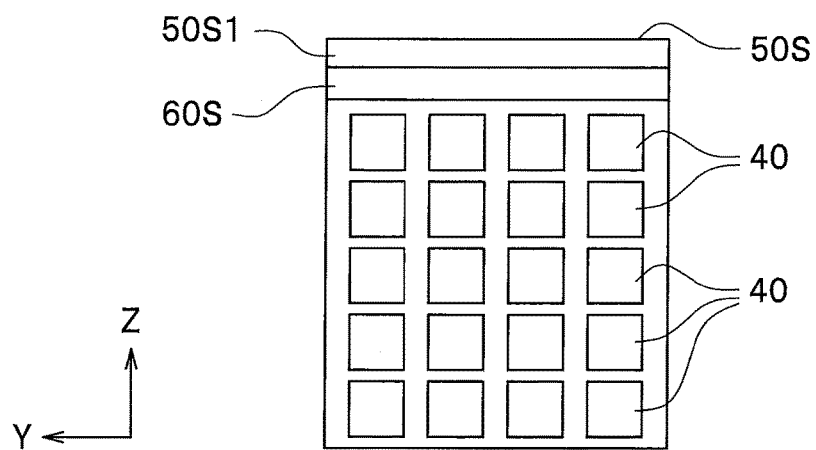
FIG. 9 is a schematic plan view of light-emitting elements coupled to a light-guiding member for schematically illustrating a manufacturing procedure of a light-emitting device according to a modification of the first embodiment.

Also, in the method of manufacturing the light-emitting device 1 in the description above, the light-emitting element 40 is bonded to the long and thin light-guiding member 50 (FIG. 3C), but the light-emitting element 40 may be bonded to the light-guiding member plate 50S. The method of manufacturing a light-emitting device in this case will be described referring to FIG. 9. FIG. 9 is a schematic plan view of a light-guiding member plate 50S, in which a polished surface 50S1 corresponds to the lower surface of the light-guiding member 50 in the cross-sectional view shown in FIG. 2. In this case, as shown in FIG. 9, a plurality of light-emitting elements 40 are arranged in a matrix on the polished surface 50S1 of the first light-guiding member 51, and bonded to the first light-guiding member 51. Next, the light-guiding member plate 50S is divided along the direction parallel to the Z-X plane at every predetermined second width so that the pieces after dividing will each include a plurality of light-emitting elements 40 aligned in the column direction (i.e., Z-axis direction) in FIG. 9 and a wavelength conversion member 60S. With this manner, the light-emitting element assembly 40A as shown in FIG. 3D can be formed. In the case where the light-emitting elements are directly bonded to the light-guiding member, the light emitting element assembly 40A is preferably formed in this manner.

INDUSTRIAL APPLICABILITY

The light-emitting devices according to the embodiments of the present invention can be used for light-emitting devices for projectors, lighting apparatuses, and vehicles.

What is claimed is:

1. A light-emitting device comprising:
a light-emitting element having a light-extracting surface;
a light-guiding member including:
  a first light-guiding member having an incident surface bonded to the light-extracting surface,
  a wavelength conversion member disposed spaced from the light-emitting element and having a surface adjacent to the incident surface of the first light-guiding member and configured to convert light from the first light-guiding member into light having a different wavelength, and
  a second light-guiding member adjacent to the wavelength conversion member and having a light-emission surface through which light from the wavelength conversion member is emitted to outside; and
a light-reflective member covering the light-emitting element and the light-guiding member so that the light-emission surface is exposed from the light reflective member,
wherein the light-emission surface has an area smaller than an area of the incident surface.

2. The light-emitting device according to claim 1, wherein the light-guiding member has a quadrangular-prism shape.

3. The light-emitting device according to claim 1, wherein the light-reflective member surrounds an entirety of an outer periphery of the light-emission surface.

4. The light-emitting device according to claim 1, wherein the light-reflective member includes:
an optical multilayered film covering the light-emitting element and the light-guiding member; and
a resin member covering at least a portion of the optical multilayered film.

5. The light-emitting device according to claim 1, wherein the light-reflective member includes:
an optical multilayered film covering the light-emitting element and the light-guiding member;
a metal layer covering the optical multilayered film; and
a resin member covering at least a portion of the metal layer.

6. The light-emitting device according to claim 1, wherein
the light-extracting surface is an upper surface of the light-emitting element,
the light-emission surface is an upper surface of the second light-guiding member, and
the second light-guiding member has a surface inclined with respect to the light-extracting surface of the light-emitting element.

7. The light-emitting device according to claim 1, wherein the light-guiding member includes one of a heatsink and a metal plate in a region not bonded to the light-extracting surface of the light-emitting element.

8. The light-emitting device according to claim 1, further comprising an optical element on the light-emission surface.

9. The light-emitting device according to claim 1, wherein the light-emitting element includes a plurality of the light-emitting elements.

10. A method of manufacturing a light-emitting device, comprising:
providing a light-guiding member including a first light-guiding member, a wavelength conversion member, and a second light-guiding member in this order;
bonding the first light-guiding member to a light-emitting element;
mounting the light-emitting element on a supporting member;
covering the light-emitting element and the light-guiding member with a light-reflective member; and
exposing a portion of a surface of the second light-guiding member from the light-reflective member to form a light-emission surface of the light-guiding member,
wherein the step of exposing the portion of the surface of the second light-guiding member includes removing a portion of the light-reflective member.

11. The method of manufacturing the light-emitting device according to claim 10, wherein the step of covering the light-emitting element and the light-guiding member with the light-reflective member includes:
covering the light-emitting element and the light-guiding member with an optical multilayered film; and
covering at least a portion of the optical multilayered film with a resin member.

12. The method of manufacturing the light-emitting device according to claim 10, wherein the step of covering the light-emitting element and the light-guiding member with the light-reflective member includes:
covering the light-emitting element and the light-guiding member with an optical multilayered film;
covering the optical multilayered film with a metal layer; and
covering at least a portion of the metal layer with a resin member.

13. The method of manufacturing the light-emitting device according to claim 10, wherein
the step of providing the light-guiding member includes processing an end surface of the second light-guiding member into a surface inclined with respect to a bonding surface between the light-emitting element and the first light-guiding member, and
the step of exposing the portion of the surface of the second light-guiding member includes exposing a portion of an upper surface of the second light-guiding member, the upper surface being connected to the inclined surface.

14. The method of manufacturing the light-emitting device according to claim 10, further comprising bonding an optical element to the light-emission surface.

15. A method for manufacturing a light-emitting device, the method comprising:
providing a plurality of light-guiding members, comprising:
  forming a light-guiding member block including a first light-guiding member, a wavelength conversion member, and, a second light-guiding member in this order; and
  dividing the light-guiding member block in a first direction to provide the plurality of light-guiding members each including the first light-guiding member, the wavelength conversion member; and the second light-guiding member in this order;
bonding a plurality of light-emitting elements to the first light-guiding member;

covering the plurality of light-emitting elements and the light-guiding member with a light-reflective member; and exposing part of a surface of the second light-guiding member from the light-reflective member to form a light-emission surface of the light-guiding member, wherein the step of exposing the portion of the surface of the second light-guiding member includes removing a portion of the light-reflective member.

16. The method of manufacturing the light-emitting device according to claim 15, wherein the step of providing the plurality of light-guiding members further includes performing dividing in a second direction perpendicular to the first direction after the dividing of the light-guiding member block in the first direction to provide the plurality of light-guiding members.

17. The method of manufacturing the light-emitting device according to claim 15, further comprising, after the step of providing the plurality of light-guiding members, forming a pair of polished surfaces by polishing two surfaces of each of the light-guiding members, the two surfaces being opposite to each other, wherein the step of bonding the plurality of light-emitting elements to the first light-guiding member includes bonding the plurality of light-emitting elements to one of the polished surfaces of the first light-guiding member.

18. The method of manufacturing the light-emitting device according to claim 15, wherein the step of providing the plurality of light-guiding members includes forming an end surface of the second light-guiding member into a surface inclined with respect to the first direction, and the step of exposing the portion of the surface of the second light-guiding member includes exposing a portion of an upper surface of the second light-guiding member, the upper surface connected to the inclined surface.

* * * * *